(12) United States Patent
Edelman

(10) Patent No.: US 6,728,569 B2
(45) Date of Patent: *Apr. 27, 2004

(54) SCOUTLESS WHOLE-BODY IMAGING WITH FAST POSITIONING

(75) Inventor: Robert R. Edelman, Highland Park, IL (US)

(73) Assignee: Evanston Northwestern Healthcare Corp., Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/999,583

(22) Filed: Oct. 25, 2001

(65) Prior Publication Data

US 2003/0083569 A1 May 1, 2003

(51) Int. Cl.⁷ .............................................. A61B 5/055
(52) U.S. Cl. ...................... 600/410; 600/415; 600/420; 600/419; 324/307; 324/309; 324/306
(58) Field of Search ................................. 600/410, 420, 600/415, 419, 421, 422, 413; 324/307, 306, 309

(56) References Cited

U.S. PATENT DOCUMENTS

| | | | | |
|---|---|---|---|---|
| 4,730,267 A | * | 3/1988 | Hughes | 708/833 |
| 4,800,889 A | | 1/1989 | Dumoulin et al. | 128/653 |
| 4,851,779 A | * | 7/1989 | DeMeester et al. | 324/312 |
| 4,884,029 A | * | 11/1989 | Sattin | 324/309 |
| 5,167,232 A | | 12/1992 | Parker et al. | 128/653.3 |
| 5,433,196 A | | 7/1995 | Fiat | 128/632 |
| 5,631,560 A | | 5/1997 | Machida | 324/309 |
| 5,810,728 A | * | 9/1998 | Kuhn | 600/410 |
| 5,830,143 A | | 11/1998 | Mistretta et al. | 600/420 |
| 5,842,989 A | | 12/1998 | Zur | 600/410 |
| 5,881,728 A | | 3/1999 | Mistretta et al. | 128/653.4 |
| 5,924,987 A | | 7/1999 | Meaney et al. | 600/420 |
| 5,928,148 A | * | 7/1999 | Wang et al. | 600/420 |
| 6,037,771 A | | 3/2000 | Liu et al. | 324/309 |
| 6,043,654 A | | 3/2000 | Liu et al. | 324/309 |
| 6,137,291 A | | 10/2000 | Szumowski et al. | 324/318 |
| 6,167,293 A | * | 12/2000 | Chenevert et al. | 600/420 |
| 6,201,393 B1 | | 3/2001 | Bernstein et al. | 324/309 |
| 6,201,986 B1 | | 3/2001 | Riederer et al. | 600/419 |
| 6,228,544 B1 | | 5/2001 | Ota | 430/30 |
| 6,230,040 B1 | | 5/2001 | Wang et al. | 600/415 |
| 6,249,694 B1 | | 6/2001 | Foo et al. | 600/420 |
| 6,259,940 B1 | | 7/2001 | Bernstein et al. | 600/410 |
| 6,268,730 B1 | | 7/2001 | Du | 324/309 |
| 6,275,035 B1 | | 8/2001 | Debbins et al. | 324/307 |
| 6,295,465 B1 | | 9/2001 | Simonetti | 600/413 |
| 6,311,085 B1 | * | 10/2001 | Meaney et al. | 600/420 |
| 6,408,201 B1 | * | 6/2002 | Foo et al. | 600/410 |
| 2001/0027262 A1 | * | 10/2001 | Mistretta et al. | 600/9 |
| 2001/0027265 A1 | * | 10/2001 | Prince | 600/9 |

OTHER PUBLICATIONS

Heid, "3D MR Angiography with Nonselective Excitation," p. 1784 in Proc. Intl. Soc. Mag. Reson. Med. vol. 8 (2000).
U.S. Dept. of Health & Human Services, "A Primer on Medical Device Interactions with Magnetic Resonance Imaging Systems," Feb. 7, 1997 draft.
Brown, "Magnetic Resonance Angiography (MRA), a Brief Overview," Sep. 1997.
"CAR Standards for Magnetic Resonance Imaging", Jun. 1999.
Ho, et al, "Automated Bolus Chase Peripheral MR Angiography", pp. 377–388 in *Journal of Magnetic Resonance Imaging*, vol. 10, 1999.

* cited by examiner

*Primary Examiner*—Eleni Mantis Mercader
(74) *Attorney, Agent, or Firm*—Welsh & Katz, Ltd.

(57) ABSTRACT

A method and apparatus are provided for forming a magnetic resonance angiographic image of a human body. The method includes the steps of applying a plurality of spatially non-selective radio-frequency pulses to the body, varying a magnitude of a phase-encoded gradient through the body in conjunction with application of the plurality of spatially non-selective radio-frequency pulses and detecting magnetic resonance imaging data from the body based upon the spatially non-selective radio-frequency pulses and varied phase-encoded gradient.

34 Claims, 2 Drawing Sheets

SCOUTLESS WHOLE-BODY IMAGING WITH FAST POSITIONING

FIELD OF THE INVENTION

The field of the invention relates to computed tomography and more particularly to magnetic resonance imaging.

BACKGROUND OF THE INVENTION

Arterial diseases and injuries are common and have severe consequences including amputation or death. Atherosclerosis, in fact, is a major problem in the aged population, particularly in the developed countries.

Atherosclerosis of the lower extremities (often, otherwise, referred to as peripheral vascular disease) is a common disorder that increases with age, ultimately affecting more than 20% of those people over the age of 75. Lesions resulting from atherosclerosis are often characterized by diffuse and multi focal arterial stenosis and occlusion.

Peripheral vascular disease often manifests itself as an intermittent insufficiency or claudication of blood flow in calf, thigh or buttocks. The symptoms of claudication often result from an inability of the body to increase blood flow during exercise.

In more extreme cases of peripheral vascular disease, blood flow of even a resting patient may be insufficient to meet basal metabolic needs of the extremities. Symptoms of blood flow insufficiency in these areas may include pain in the forefoot or toes or, in extreme cases, non-healing ulcers or gangrene in the affected limb.

One of the most effective means of diagnosing and treating atherosclerosis is based upon the use of magnetic resonance angiography (MRA) to create images of portions of the vascular system. As is well known, MRA is a form of magnetic resonance imaging (MRI) which is especially sensitive to the velocity of moving blood. More specifically, MRA generates images by relying upon an enhanced sensitivity to a magnitude and phase of a signal generated by moving spins present within flowing blood.

MRA, in turn, can be divided into three types of categories: 1) time of flight (TOF) or inflow angiography; 2) phase contrast (PC) angiography (related to the phase shift of the flowing proton spins) and 3) dynamic gadolinium enhanced (DGE) MRA. While the three types of MRA are effective, they all suffer from a number of deficiencies.

The predominant deficiency of all three types of existing MRA techniques relates to speed of data collection. For example, patient motion is known to significantly degrade image quality of TOF MRA. To avoid image degradation, a patient undergoing DGE MRA is typically required to hold his breath during data collection. PC MRA relies upon the use of long time-to-echo (TE) intervals for signal sampling that result in other T2 effects that tend to degrade image quality. Because of the importance of MRA, a need exists for MRA methods that are less reliant upon time or upon movement of the patient.

SUMMARY

A method and apparatus are provided for forming a magnetic resonance angiographic image of a human body. The method includes the steps of applying a plurality of spatially non-selective radio-frequency pulses to the body, varying a magnitude of a phase-encoded gradient through the body in conjunction with application of the plurality of spatially non-selective radio-frequency pulses and detecting magnetic resonance imaging data from the body based upon the spatially non-selective radio-frequency pulses and varied phase-encoded gradient.

DETAILED DESCRIPTION OF AN ILLUSTRATED EMBODIMENT

Figure 1:
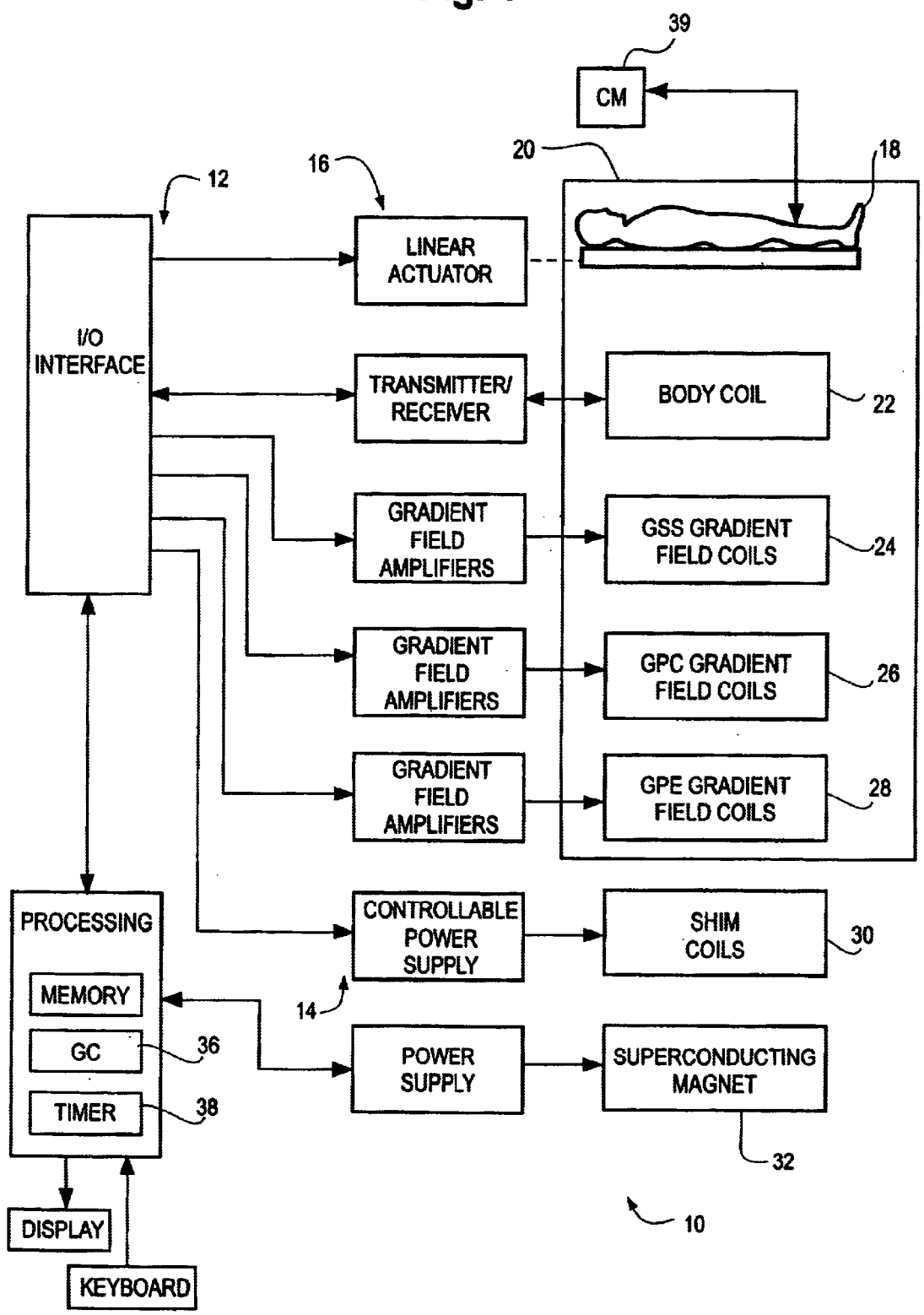
FIG. 1 is a block diagram of a magnetic imaging angiography system in accordance with an illustrated embodiment of the invention.

FIG. 1 is a block diagram of a magnetic resonance imaging system 10 under an illustrated embodiment of the invention. While the system 10 is amenable to a number of different modes of use, one illustrated method provides faster contrast-enhanced multi-station magnetic resonance angiography (MRA), that eliminates the need for the acquisition of scout images and/or manual positioning of the patient for collecting specific imaging volumes. As used herein, the term "scout images" refers to coarse images collected specifically for the purpose of aligning imaging volumes among imaging stations.

Figure 2:
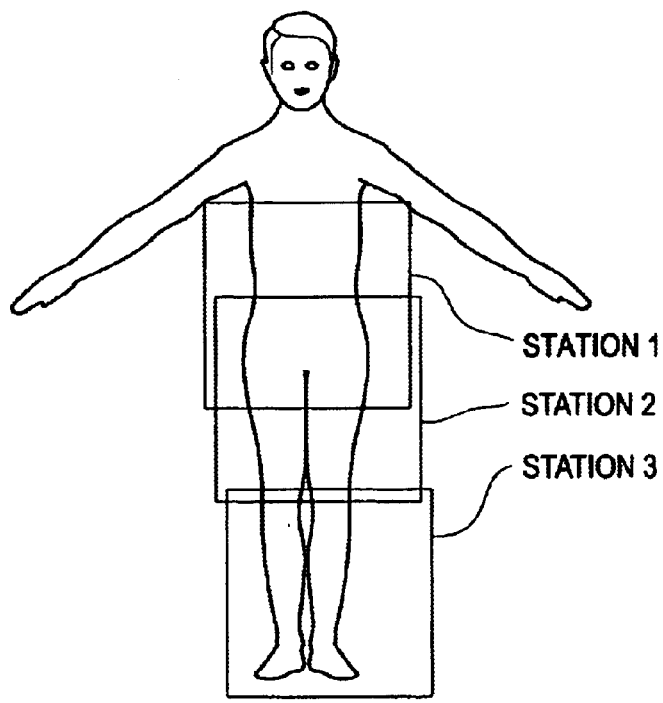
FIG. 2 depicts a series of imaging stations that may be used by the system of FIG. 1.

With conventional moving table MRA, MRA image data is collected at each of a number (two or more) of imaging Stations (FIG. 2) in order to follow the passage of an intravenously administered contrast agent. Because the data are typically acquired over a volume of finite thickness that is smaller than the thickness of the body part, the three-dimensional (3D) imaging volume must be carefully selected (i.e., the imaging equipment must be carefully positioned) so as to encompass all the major arteries. The process of acquiring scout images to locate the arteries for positioning the equipment and then setting up the 3D acquisition at each imaging station may require many minutes, which is inefficient, uncomfortable for the patient, and may result in motion artifacts. Moreover, imperfect positioning of the imaging equipment may result in the false impression of vessel occlusion.

The system 10 of FIG. 1 uses a unique combination of techniques discussed in more detail below in order to permit the essentially foolproof acquisition of MRA data from multiple stations without the need for obtaining scout images to locate vessels or for manual positioning of each 3D imaging volume within an imaging space. This may be accomplished by acquiring the imaging data through the entire thickness of the body, rather than through only a finite thickness of the body.

The imaging data acquired through the thickness of the body by the system 10 may be obtained through relatively thin slices. Because the speed of acquisition is relatively fast, the total time for data acquisition over the three imaging stations of FIG. 2 may be less than 30 seconds. Because the data acquisition time is relatively short, patient motion becomes less of a concern. T1 weighting may be used in conjunction with the acquired data to discriminate contrast-enhanced blood vessels. Arteries may be selectively displayed without enhancement of veins.

As shown in FIG. 1, the system 10 for collecting MRA images of a patient 18 may include three subsystems 12, 14, 16. A patient movement subsystem 16 may be used to move the patient 18 among the imaging stations of FIG. 2 and to control the movement of a patient transport table within a scanning zone 20 of the system 10. A signal processing subsystem 14 may provide the magnetic fields and control transmission and detection of radio frequency (RF) signals from resonant atoms within the patient 18. A control subsystem 12 may provide programming and control of the first and second subsystems 14, 16.

The first and second subsystems 14, 16 may be conventional. A body coil 22 may be used for the transmission of RF pulses and to detect resonant signals. First, second and third gradient field coils 24, 26, 28 may be used to create and control gradient magnetic fields within the body coil 22. A superconducting magnet 32 and shim coils 30 may be used to provide a static magnetic field within the scanning zone 20.

In order to prepare the patient 18 for angiography a contrast agent (e.g., gadolinium-chelate) 34 may be injected into the patient 18. The contrast agent 34 may be administered using any appropriate method (e.g., hypodermic needle). As the contrast agent 34 passes through the body, the patient movement subsystem 16 may move the patient 18 through a series of overlapping positions, such as those shown in FIG. 2.

To collect image data through the thickness of the body, a spatially non-selective RF pulse may be applied through the body coil 22 without the necessity for any, or only a relatively low level, slice selective gradient Gss that would otherwise be applied at the same time as the RF pulse. Because of the relatively constant frequency of the spatially non-selective RF pulse and the absence of phase-encoding gradients, the spatially non-selective RF pulse need only be a fraction of the length of a spatially selective RF pulse. Also, because of the short duration of the spatially non-selective RF pulse, the minimum repetition time is much shorter. Repetition rates of less than 3 milliseconds (ms), in fact, are possible using the spatially non-selective RF pulse.

Figure 3:
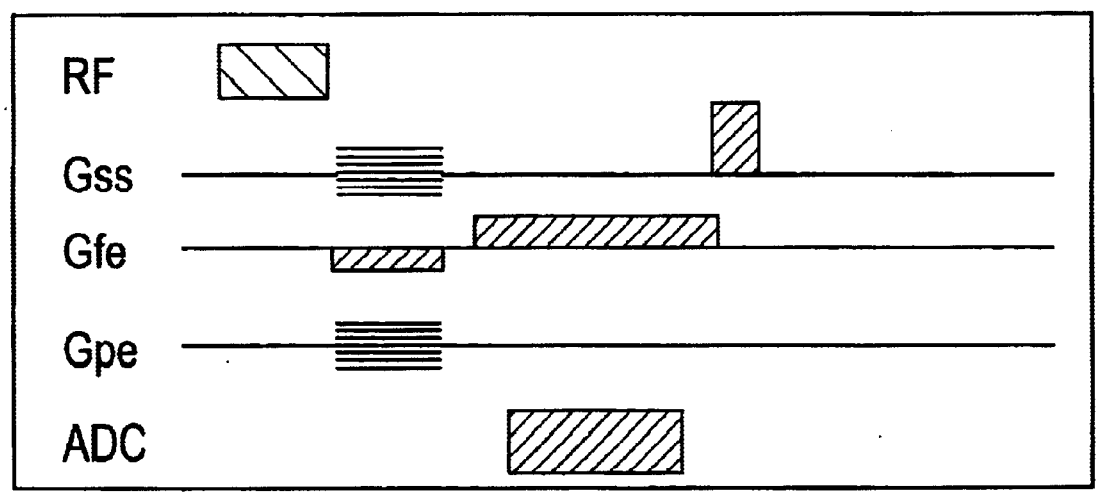
FIG. 3 depicts a pulse sequence that may be used by the system of FIG. 1.

FIG. 3 depicts a 3D gradient-echo pulse sequence using the spatially non-selective RF pulse. The RF pulse may remain relatively constant among pulse sequences, as does the frequency encoding gradient Gfe and the timing of data collection through the analog-to-digital converter (ADC). The absence of any slice selection gradient during the RF pulse should be specifically noted in FIG. 3. The absence of any slice selection gradient during the RF pulse allows the RF pulse to be spatially non-selective in its effect on resonant atoms.

In order to collect data based upon each spatially non-selective RF pulse of FIG. 3, the phase-encoding gradient Gss, in the slice direction and the phase-encoding gradient in the in-plane direction may be varied by a gradient controller 36 in some predetermined manner. As used herein, varying the phase-encoding gradients means applying a number of phase-encoded gradient combinations among pulse sequences (after the RF pulse has ended) in the slice selective and in-plane directions while collecting data for each combination under conditions of a constant frequency-encoding gradient and constant three-dimensional spatially non-selective frequency pulses among the pulse sequences.

For example, the full-scale range of the phase-encoding gradients in the slice and also the in-plane directions may each be divided up into a number of incremental steps (e.g., 64–256). Data may be collected by selecting a value for the first phase-encoding gradient while varying a value of the second phase-encoding gradient. After collecting data over a range of values for the second phase-encoding gradient, a new value may be selected for the first phase-encoding gradient and the process may be repeated until a full complement of data has been collected. A full complement of data may mean collecting data for each combination of phase-encoded gradients within an imaging area.

As a further, more detailed example, a lowest relative value may be chosen for the first phase-encoding (slice selective) gradient. Next a lowest relative value of the second phase-encoding (in-plane) gradient may be selected and a first set of data may be collected using these two phase-encoding values via the use of the sequence of FIG. 3. Following collection of the first set of data, the phase-encoding value of the second phase-encoding gradient may be incremented and a second set of data may be collected.

The process of incrementing the second phase-encoding gradient value (and collecting data sets) may be repeated until a maximum gradient value is achieved for the second phase-encoding gradient. Once the maximum value is achieved for the second phase-encoding gradient, the first phase-encoding gradient may be incremented and the process may be repeated. The process may be repeated by as many steps that it takes to increment the first phase-encoding gradient from a minimum value to a maximum value.

The process of incrementing phase-encoded gradient levels in both the slice and in-plane directions may be continued until data collection for a first body portion (e.g., the body portion referred to as Station 1 in FIG. 2) has been completed. The imaging system 10 may then wait a predetermined time period measured by a timer 38 for the contrast medium to reach the next station. Following the predetermined time period, the system 10 may move to overlapping Station 2 and the process may be repeated. Following data collection and another predetermined time period, the system 10 may move to Station 3 and the process may be again repeated. Alternatively, data acquisition can be automatically triggered at each station to optimize contrast enhancement of vessels of interest by comparing intravascular signal intensity with an intensity threshold value and triggering imaging acquisition when the intravascular signal intensity exceeds the intensity threshold value.

Because of the ability of the system 10 to form an image slice across the entire thickness of the body, it is possible to automatically correlate a slice collected at one station with a slice collected at another station. The fact that the stations overlap also simplifies the comparison because correlation may simply involve identifying the slice of one station that substantially matches a slice collected through another adjacent station.

The voltage of the spatially non-selective RF pulse may be adjusted to produce a relative large flip-angle (e.g., 15–60 degrees). Further, the large number of phase-encoding steps have been found to provide relatively thin sections despite the relatively large excitation volume.

To further improve imaging integrity a number of different types of saturation pulses may be applied. For example, a non-selective RF saturation pulse may be applied at regular intervals to preferentially reduce signal intensity from non-vascular structures. Alternatively, a chemical shift-selective RF saturation pulse may be applied at regular intervals to preferentially reduce the signal intensity from fat-containing tissue.

Further, gradient or RF spoiling may be used to disperse transverse magnetization. The dispersion of transverse magnetization may be used as a method of improving T1 contrast.

A number of previously known imaging techniques may also be used to further enhance imaging integrity. For example, partial Fourier imaging may be used where appropriate. Alternatively, parallel imaging (e.g., SENSE or SMASH-like techniques) may also be used. A rectangular field of view may be imposed to optimize imaging data.

Data may be acquired repeatedly so as to create a series of temporally-distinct MR angiograms spanning parts or all of the time course of the passage of the contrast agent through the vessels of interest. This can be accomplished by any of a variety of techniques, including the use of a very short repetition time, partial k-space acquisition, or other methods of k-space coverage such as "TRICKS" or "keyhole imaging" methods.

Further, image enhancement may be used to improve upon the data actually collected. For example, data may be interpolated along the slice direction to enhance small objects and eliminate discontinuities.

Before and after images may also be used. Acquisition of a series of "mask" images may be collected before administration of contrast material. The mask images may be used to mask out unwanted structures.

Further, the use of measured data values may also be used for image enhancement. Magnitude or complex data subtraction may be used to highlight contrasted-enhanced areas over areas without contrast enhancement.

Accurate table positioning has been recognized as an important factor in image subtraction. However, since the images of adjacent stations can be easily correlated, image subtraction becomes relatively simply using the data provided by the system 10.

Image subtraction has been shown to provide improved arterial imaging by eliminating spurious signal artifacts (e.g., phase wrap, venous in-flow enhancement, etc.). Image subtraction has been found to have great value in the imaging of the distal tibioperoneal arteries.

A specific embodiment of a method and apparatus for performing magnetic resonance angiography has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. An apparatus for forming a magnetic resonance angiographic image of a human body comprising:
   means for applying a first plurality of spatially non-selective radio-frequency pulses to a first imaging volume of the human body;
   means for applying a first plurality of combinations of magnitude of phase-encoding gradients in slice-selective and in-plane directions through the first imaging volume of the human body in conjunction with application of the first plurality of spatially non-selective radio-frequency pulses;
   means for detecting first magnetic resonance imaging data from the first imaging volume of the human body based upon the first plurality of spatially non-selective radio-frequency pulses and the applied first plurality of combinations of magnitude of phase-encoding gradients;
   means for applying a second plurality of spatially non-selective radio-frequency pulses to a second imaging volume of the human body;
   means for applying a second plurality of combinations of magnitude of phase-encoding gradients in slice-selective and in-plane directions through the second imaging volume of the human body in conjunction with application of the second plurality of spatially non-selective radio-frequency pulses;
   means for detecting second magnetic resonance imaging data from the second imaging volume of the human body based upon the second plurality of spatially non-selective radio-frequency pulses and the applied second plurality of combinations of magnitude of phase-encoding gradients; and
   means for positioning the human body and acquiring the first and second magnetic resonance imaging data of the first and second imaging volumes without the use of scout images forming the magnetic resonance angiographic image.

2. The apparatus for forming a magnetic resonance angiographic image as in claim 1 further comprising means for injecting a contrast agent into the human body.

3. The apparatus for forming a magnetic resonance angiographic image as in claim 2 further comprising means for moving the human body into an imaging zone.

4. The apparatus for forming a magnetic resonance angiographic image as in claim 3 further comprising means for moving the human body through the imaging zone to track the contrast agent.

5. A method of forming a magnetic resonance angiographic image of a human body comprising the steps of:
   applying a first plurality of spatially non-selective radio-frequency pulses to a first imaging volume of the human body;
   applying a first plurality of combinations of magnitude of phase-encoding gradients in slice-selective and in-plane directions through the first imaging volume of the human body in conjunction with application of the first plurality of spatially non-selective radio-frequency pulses;
   detecting first magnetic resonance imaging data from the first imaging volume of the human body based upon the first plurality of spatially non-selective radio-frequency pulses and the applied first plurality of combinations of magnitude of phase-encoding gradients;
   applying a second plurality of spatially non-selective radio-frequency pulses to a second imaging volume of the human body;
   applying a second plurality of combinations of magnitude of phase-encoding gradients in slice-selective and in-plane directions through the second imaging volume of the human body in conjunction with application of the second plurality of spatially non-selective radio-frequency pulses;
   detecting second magnetic resonance imaging data from the second imaging volume of the human body based upon the second plurality of spatially non-selective radio-frequency pulses and the applied second plurality of combinations of magnitude of phase-encoding gradients; and
   positioning the human body and acquiring the first and second magnetic resonance imaging data of the first and second imaging volumes without the use of scout images forming the magnetic resonance angiographic image.

6. The method of forming a magnetic resonance angiographic image as in claim 5 further comprising injecting a contrast agent into the human body.

7. The method of forming a magnetic resonance angiographic image as in claim 6 further comprising moving the human body into an imaging zone.

8. The method of forming a magnetic resonance angiographic image as in claim 7 further comprising moving the human body through the imaging zone to track the contrast agent.

9. The method of forming a magnetic resonance angiographic image as in claim 5 further comprising applying a non-selective RF saturation pulse to the human body to preferentially reduce a signal intensity from non-vascular structures.

10. The method of forming a magnetic resonance angiographic image as in claim 5 further comprising applying a chemical shift-selective RF saturation pulse to preferentially reduce signal intensity form fat-containing tissues.

11. The method of forming a magnetic resonance angiographic image as in claim 5 performing partial Fourier imaging of the detected first and second magnetic resonance imaging data.

12. The method of forming a magnetic resonance angiographic image as in claim 5 performing parallel imaging of the detected first and second magnetic resonance imaging data.

13. The method of forming a magnetic resonance angiographic image as in claim 5 forming a rectangular field of view of the detected first and second magnetic resonance imaging data.

14. The method of forming a magnetic resonance angiographic image as in claim 5 interpolating among the detected first and second magnetic resonance imaging data.

15. The method of forming a magnetic resonance angiographic image as in claim 5 further comprising acquiring a series of mask images before administering a contrast agent.

16. The method of forming a magnetic resonance angiographic image as in claim 5 further comprising using magnitude or complex data subtraction to form the magnetic resonance angiographic image.

17. The method of forming a magnetic resonance angiographic image as in claim 5 further comprising repeating the steps of claim 5 to create a series of temporally-distinct magnetic resonant angiograms spanning parts or all of the time course of the passage of a contrast agent through a vessel of interest using one of the group of techniques comprising a very short repetition time or partial k-space acquisition or TRICKS or keyhole imaging.

18. The method of forming a magnetic resonance angiographic image as in claim 5 further comprising comparing intravascular signal intensity with an intensity threshold value and when the intravascular signal intensity exceeds the intensity threshold value automatically triggering data acquisition at each station to optimize contrast enhancement of vessels of interest.

19. An apparatus for forming a magnetic resonance angiographic image of a human body comprising:
   a body coil adapted to apply a first plurality of spatially non-selective radio-frequency pulses to a first imaging volumes of the human body and a second plurality of spatially non-selective radio-frequency pulses to a second imaging volume of the human body;
   a controller adapted to apply a first plurality of combinations of magnitude of phase-encoding gradients in a first slice-selective and a first in-plane directions through the first imaging volume of the human body in conjunction with application of the first plurality of spatially non-selective radio-frequency pulses and to apply a second plurality of combinations of magnitude of phase-encoding gradients in a second slice-selective and a second in-plane directions through the second imaging volume of the human body in conjunction with application of the second plurality of spatially non-selective radio-frequency pulses;
   and a receiver adapted to detect magnetic resonance imaging data from the first and second imaging volumes of the human body based upon the first and second plurality of spatially non-selective radio-frequency pulses and applied first and second plurality of combinations of magnitude of phase-encoding gradients; and
   a signal processing subsystem adapted to position the human body and acquire imaging data of the first and second magnetic resonance imaging volumes without the use of scout images forming a magnetic resonance angiographic image.

20. The apparatus for forming a magnetic resonance angiographic image as in claim 19 comprising a Gss gradient field coil adapted to vary the first and second plurality of combinations of magnitude of the first and second phase-encoding gradients in an the first and second slice-selective direction.

21. The apparatus for forming a magnetic resonance angiographic image as in claim 19 comprising a Gpe gradient field coil adapted to vary the first and second plurality of combinations of magnitude of the first and second phase-encoding gradients in the first and second in-plane directions.

22. The apparatus for forming a magnetic resonance angiographic image as in claim 19 comprising a gradient controller adapted to vary the first and second plurality of combinations of magnitude of the phase-encoding gradients in the first and second slice-selective directions and in the first and second in-plane directions.

23. The apparatus for forming a magnetic resonance angiographic image as in claim 22 further comprising a hypodermic needle adapted to inject a contrast agent into the human body.

24. The apparatus for forming a magnetic resonance angiographic image as in claim 23 further comprising a patient movement subsystem adapted to move the human body into an imaging zone.

25. The apparatus for forming a magnetic resonance angiographic image as in claim 24 further comprising a timer adapted to move the human body through the imaging zone to track the contrast agent.

26. A method of forming a magnetic resonance image of a plurality of body parts comprising the steps of:
   applying a first plurality of three-dimensional spatially non-selective radio-frequency pulses to a first body part of the plurality of body parts;
   applying a first respective set of phase encoded gradient steps in a first slice-selective and first in-plane directions to the first body part in conjunction with each of the first plurality of three-dimensional spatially non-selective radio-frequency pulses;
   applying a first respective set of phase encoded gradient steps in a first in-slice and first in-plane directions to the first body part in conjunction with each of the first plurality of three-dimensional spatially non-selective radio-frequency pulses;
   applying a second plurality of three dimensional spatially non-selective radio-frequency pulses to a second body part of the plurality of body parts;
   applying a second respective set of phase encoded gradient steps in a second in-slice and second in-plane directions to the second body part in conjunction with each of the second plurality of three dimensional spatially non-selective radio-frequency pulses; and positioning the human body, acquiring a first image of the first body part from the first plurality of three dimensional spatially non-selective radio-frequency pulses and first set of phase encoded gradient steps and a second image of the second body part from the second plurality of three dimensional non-selective radio frequency pulses and second set of phase encoded gradient steps and aligning the first image of the first body part with the second image of the second body part without the use of scout images forming the magnetic resonance angiographic image.

27. The method of forming a magnetic resonance image as in claim 26 further comprising limiting a temporal length of the first and second plurality of three dimensional spatially non-selective radio-frequency pulses to less than three milliseconds.

28. The method of forming a magnetic resonance image as in claim 26 further comprising defining the first image of the first body part and the second image of the second body parts as overlapping.

29. The method of forming a magnetic resonance image as in claim 26 wherein the first and second plurality of three dimensional spatially non-selective radio-frequency pulses further comprise gradient echo pulse sequences.

30. The method of forming a magnetic resonance image as in claim 26 wherein the first second plurality of three dimensional spatially non-selective radio-frequency pulses further comprise spin-echo pulse sequences.

31. The method of forming a magnetic resonance image as in claim 26 wherein the first and second plurality of three dimensional spatially non-selective radio-frequency pulses further comprise spiral pulse sequences.

32. The method of forming a magnetic resonance image as in claim 26 wherein the first and second plurality of three dimensional spatially non-selective radio-frequency pulses further comprise echo planar pulse sequences.

33. The method of forming a magnetic resonance image as in claim 26 wherein the first and second plurality of three dimensional spatially non-selective radio-frequency pulses further comprise steady-state free precession pulse sequences.

34. The method of forming a magnetic resonance image as in claim 26 wherein the first and second plurality of three dimensional spatially non-selective radio-frequency pulses further comprise a hybrid of gradient echo, spin echo, spiral, echo planar and steady-state free precession pulse sequences.

* * * * *